United States Patent [19]

Ryou

[11] Patent Number: 5,447,881
[45] Date of Patent: Sep. 5, 1995

[54] METHOD FOR THE FABRICATION OF CAPACITOR IN SEMICONDUCTOR DEVICE

[75] Inventor: Eui K. Ryou, Ichonkun, Rep. of Korea

[73] Assignee: Hyundai Electronics Industries Co., Ltd., Rep. of Korea

[21] Appl. No.: 247,238

[22] Filed: May 23, 1994

[30] Foreign Application Priority Data

May 21, 1993 [KR] Rep. of Korea ............... 1993-8840

[51] Int. Cl.6 .................................... H01L 21/8242
[52] U.S. Cl. ............................ 437/60; 437/47; 437/52; 437/919
[58] Field of Search ............... 437/47, 48, 52, 60, 437/919, 229

[56] References Cited

U.S. PATENT DOCUMENTS

| | | | |
|---|---|---|---|
| 5,023,203 | 6/1991 | Choi | 437/229 |
| 5,061,650 | 10/1991 | Dennison et al. | 637/60 |
| 5,084,405 | 1/1992 | Fazan et al. | 437/60 |
| 5,102,820 | 4/1992 | Chiba | 437/52 |
| 5,192,702 | 3/1993 | Tseng | 437/52 |
| 5,266,512 | 11/1993 | Kirsch | 437/919 |
| 5,296,410 | 3/1994 | Yang | 437/229 |
| 5,330,614 | 7/1994 | Ahn | 437/60 |
| 5,380,673 | 1/1995 | Yang et al. | 437/60 |
| 5,393,688 | 2/1995 | Motonami et al. | 437/52 |

*Primary Examiner*—Brian E. Hearn
*Assistant Examiner*—Tuan Nguyen
*Attorney, Agent, or Firm*—Merchant, Gould, Smith, Edell, Welter & Schmidt

[57] ABSTRACT

There is disclosed a method for the fabrication of capacitor, comprising the steps of: planing an insulating film formed over a transistor and contacting a polysilicon film for charge storage electrode with an active region of the transistor; forming a photosensitive film pattern with a predetermined size over the polysilicon film and forming a spacer insulating film at each of the side walls of the photosensitive film pattern; subjecting the polysilicon film to etch, so as to thin it partly, in the state of using the photosensitive film pattern and the spacer insulating films as an etch mask; removing the photosensitive film pattern and forming a polysilicon film for spacer with a certain thickness over the resulting structure; etching the polysilicon film for spacer, to form a spacer polysilicon film at each of the side walls of the spacer insulating film; subjecting the polysilicon film for charge storage electrode to etch in the state of using the spacer insulating film and the spacer polysilicon film to the degree that the insulating film is exposed but the polysilicon film for charge storage electrode between the spacer polysilicon films is still left; removing the spacer insulating film; and depositing a dielectric film on the polysilicon film for charge storage electrode and spacer polysilicon films exposed and forming a plate electrode.

4 Claims, 4 Drawing Sheets

METHOD FOR THE FABRICATION OF CAPACITOR IN SEMICONDUCTOR DEVICE

BACKGROUND OF THE INVENTION

1. Field of the invention

The present invention relates, in general, to a method For the fabrication of a capacitor in a semiconductor device and, more particuarly, to a method capable of augmenting the effective area of a charge storage electrode, thereby affording increased capacitance to the capacitor.

2. Description of the Prior Art in relation with the integration of dynamic random access memory (hereinafter referred to as "DRAM") in a semiconductor memory device for general use, critical characteristics include the reduction of cell area and the limit in securing enough capacitance according to the reduction. For the purpose of high integration of a semiconductor integrated circuit, the reduction in unit area of the cell results in reduced capacitance. Accordingly, research and development efforts have been directed to securing not only the capacitance but also device reliability.

For a better understanding of the background of the present invention, thee description of a conventional method for fabricating a capacitor in a semiconductor device along with its problems is given next, with reference to FIG. 1.

As shown in this figure, over a silicon substrate 1 is a field oxide film 2 formed and then, a field oxide film 3 is formed. The deposition of polysilicon film and the implantation of impurities form a pattern of a gate electrode 4 and a word line 4'.

Thereafter, for the sake of the improvement in electrical properties of a metal oxide semiconductor field effect transistor (hereinafter referred to as "MOSFET"), a MOSFET formation process utilizing spacer oxide films 5 is carried out to form active regions 6,6' having a structure of lightly doped drain (hereinafter referred to as "LDD").

Subsequently, an insulating oxide film 7 with a certain thickness is formed, followed by the formation of a contact hole exposing the active region therethrough. A polysilicon film 9 for charge storage electrode implanted with impurities is deposited, coming into contact with the active region through the contact hole. The polysilicon film 9 is patterned on a mask, to form a charge storage electrode.

Over the charge storage electrode, there is covered a composite dielectric film 13, such as nitride-oxide (hereinafter referred to as "NO") or oxide-nitride-oxide (hereinafter referred to as "ONO"), which, in turn, is covered with a plate electrode 14 which is formed by patterning a polysilicon film implanted with impurities in a predetermined size.

In the light of the capability of present processing, however, the conventional method has difficulty in securing enough charge storage capacitance in a cell as the device is highly integrated. In addition, device reliability becomes deteriorated with the indicated difficulties.

SUMMARY OF THE INVENTION

Therefore, an object of the present invention is to overcome the above problems encountered in the prior art and to provide a method for the fabrication of a capacitor, capable of increasing the effective area of charge storage electrode sufficient to achieve a high degree of integration in a semiconductor device.

In accordance with the present invention, the above object of the present invention can be accomplished by providing a method for the fabrication of a capacitor in a semiconductor device, comprising the steps of: planing an insulating film formed over a transistor and contacting a polysilicon film for charge storage electrode with an active region of the transistor; forming a photosensitive film pattern with a predetermined size over the polysilicon film and forming a spacer insulating film at each of the side walls of the photosensitive film pattern; subjecting the polysilicon film to etch, so as to thin it partly using the photosensitive film pattern and the spacer insulating films as an etch mask; removing the photosensitive film pattern and forming a polysilicon film for spacer with a certain thickness over the resulting structure; etching the polysilicon film for spacer to form a spacer polysilicon film at each of the side walls of the spacer insulating film; subjecting the polysilicon film for charge storage electrode to etch using the spacer insulating film and the spacer polysilicon film to the degree that the insulating film is exposed but the polysilicon film for charge storage electrode between the spacer polysilicon films is still left; removing the spacer insulating film; and depositing a dielectric film on the polysilicon film for charge storage electrode and exposed spacer polysilicon films, and forming a plate electrode.

BRIEF DESCRIPTION OF THE DRAWINGS

The above object arid other advantages of the present invention will become more apparent by describing in detail the preferred embodiment of the present invention with reference to the attached drawings in which.

DETAILED DESCRIPTION OF THE INVENTION

Figure 1:
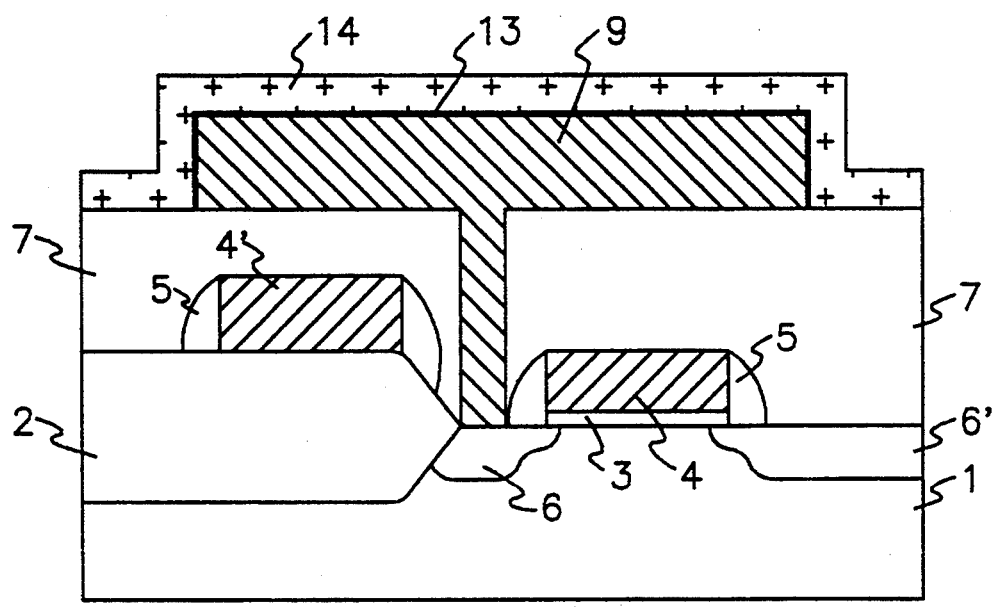
FIG. 1 is a schematic, cross sectional view illustrating a conventional method for the fabrication of a capacitor.

Hereinafter, the preferred embodiment of the present invention will be described with reference to the accompanying drawings, wherein like reference numerals designate like parts, respectively.

Referring initially to FIGS. 2A through 2D, there is illustrated a method for the fabrication of a capacitor according to the present invention.

Figure 2A:
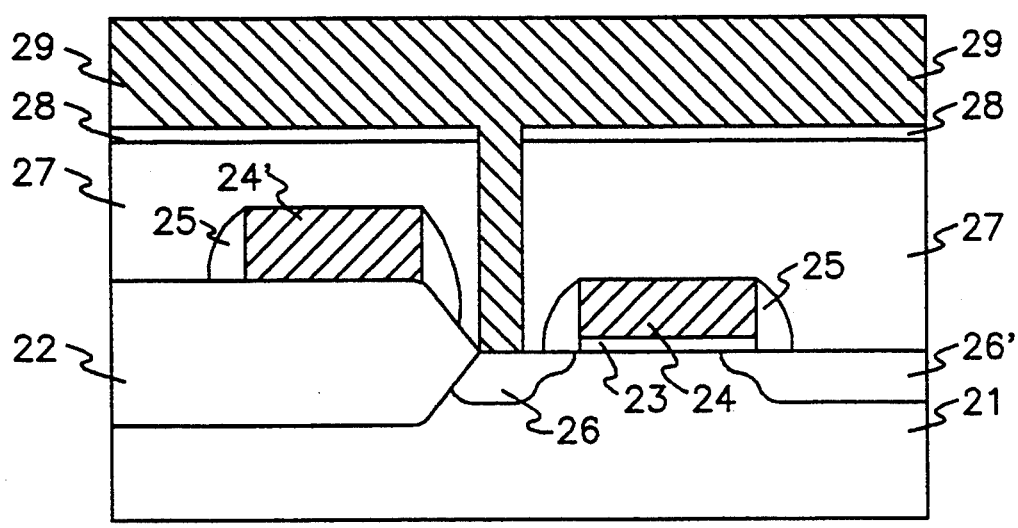
FIGS. 2A through 2E are schematic, cross sectional views illustrating a method for the fabrication of a capacitor, according to the present invention.

First, as illustrated in FIG. 2A, on a silicon substrate 21 having a P-well, a field oxide film 22 is formed by performing a so-called LOGOS (local oxidation of silicon), process and a gate oxide film 28 is deposited, followed by the deposition of a first polysilicon film for both gate electrode and word line without time delay.

This figure also shows a gate electrode 24 and a word line 24' both of which are formed by implanting impurities into the first polysilicon film and etching this polysilicon film by use of a mask. Relatively low density N-type impurities are implanted into the silicon substrate 21 and then, a spacer oxide film 25 is formed at each of the side walls of the gate electrode 24, followed by the implantation of relatively high density N-type impurities into the silicon substrate 21. As a result of these implantations, an MOSFET having an LDD structure of active regions 26, 26' comes to be formed, It is further illustrated in FIG. 2A that over the resulting structure including the MOSFET, there is entirely formed a thick insulating oxide film 27, which is subsequently subjected into blanket etching, to plane the surface thereof. On the planed insulating film 27, a silicon nitride film 28 serving as an etch stopper is formed to a certain thickness.

Thereafter, using a mask, selective etch is carried out, so as to form a contact hole exposing the active region 26 of the MOSFET therethrough.

A polysilicon film 29 for charge storage electrode into which impurities are implanted is deposited so as to come into contact with the active region through the contact hole. At this point, the charge storage electrode 29 is preferably spread more extensively than the word line 24' and the gate electrode 24.

Figure 2B:
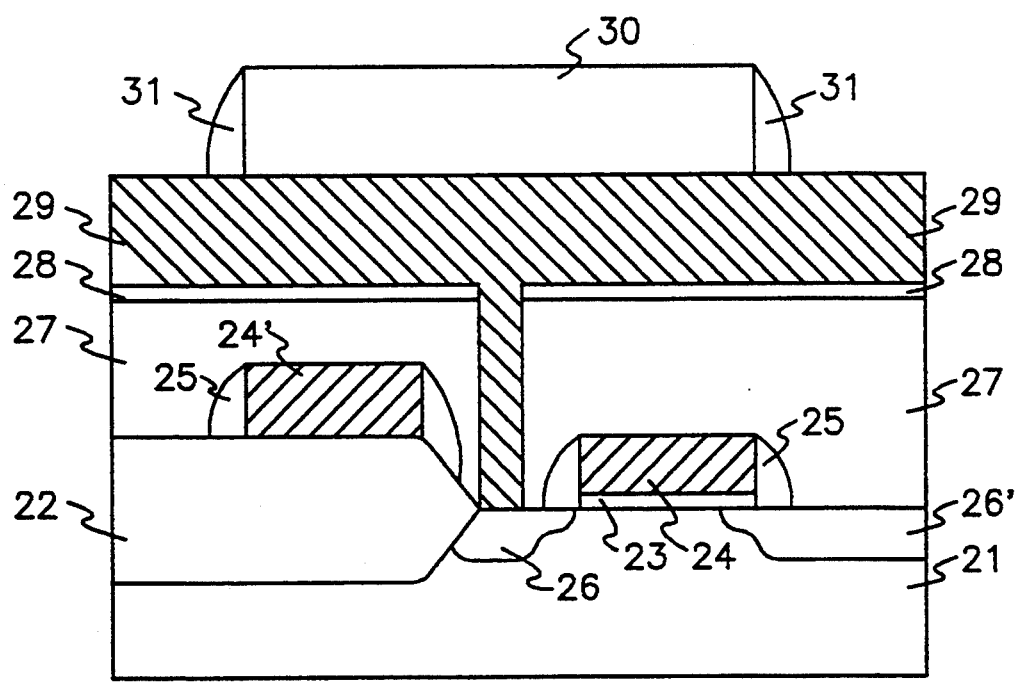

Next, as illustrated in FIG. 2B, using a charge storage electrode mask, a photosensitive pattern 30 is developed, and a sacrificial oxide film is formed which covers the photosensitive pattern 30 and then is subjected to anisotropic etch to form a spacer sacrificial oxide film 31 at each of the side walls of the photosensitive pattern 30.

Figure 2C:
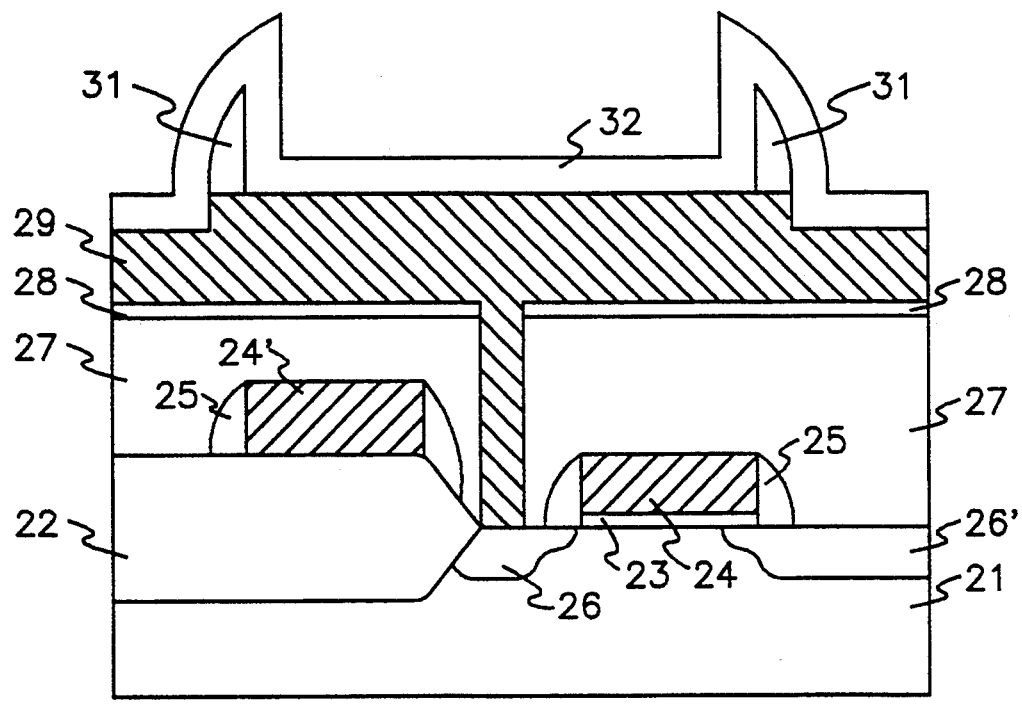

Subsequently, as illustrated in FIG. 2C, using the photosensitive film pattern 30 and the spacer sacrificial oxide films 31 as an etch mask the polysilicon film 29 for charge storage electrode is subjected to etch, so that it is attenuated in exposed portions. It is also shown in this figure that the photosensitive film pattern 30 is removed, followed by the formation of a polysilicon film 32 over the resulting structure.

Thereafter, the polysilicon film 32 is subjected to blanket etch to form a spacer polysilicon film 32' beside each of the spacer sacrificial oxide films 31. This blanket etch is carried out until the polysilicon film 29 for charge storage electrode is completely removed at its attenuated portions in FIG. 2C, but left at a portion covered with the etch mask. As a result, a cylindrical charge storage electrode which will be formed later from the polysilicon film 29 is separated from neighboring cells and has stepped parts there in.

Figure 2D:
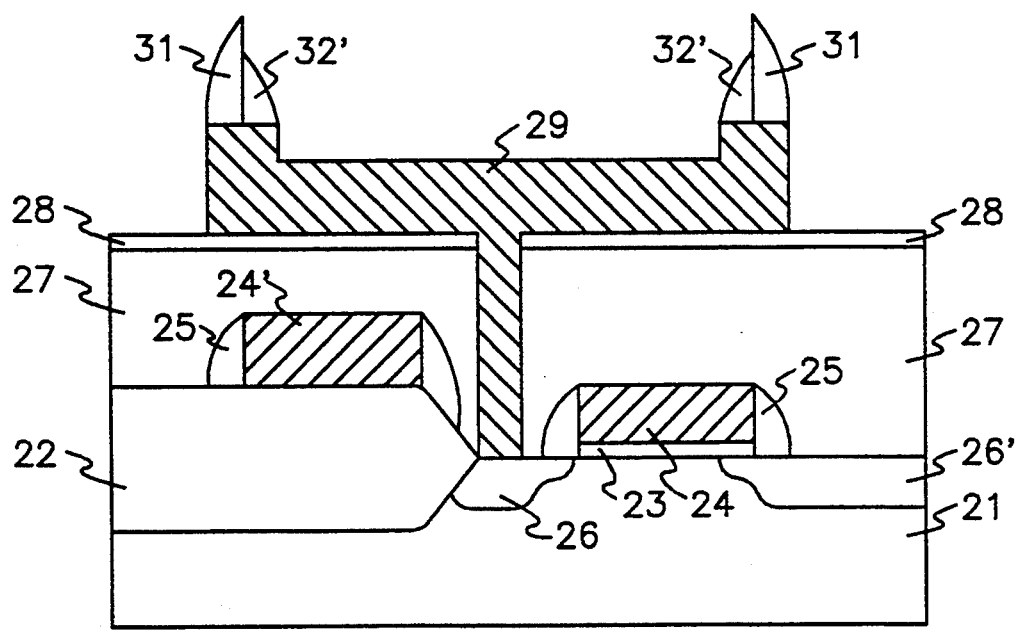

Finally, as illustrated in FIG. 2D, wet etch is applied, to remove the spacer sacrificial oxide films 31. Along the exposed surface of the spacer polysilicon films 32' and polysilicon film 29, there is formed a composite dielectric film 33, as shown in FIG. 2E such as NO or ONO.

Figure 2E:
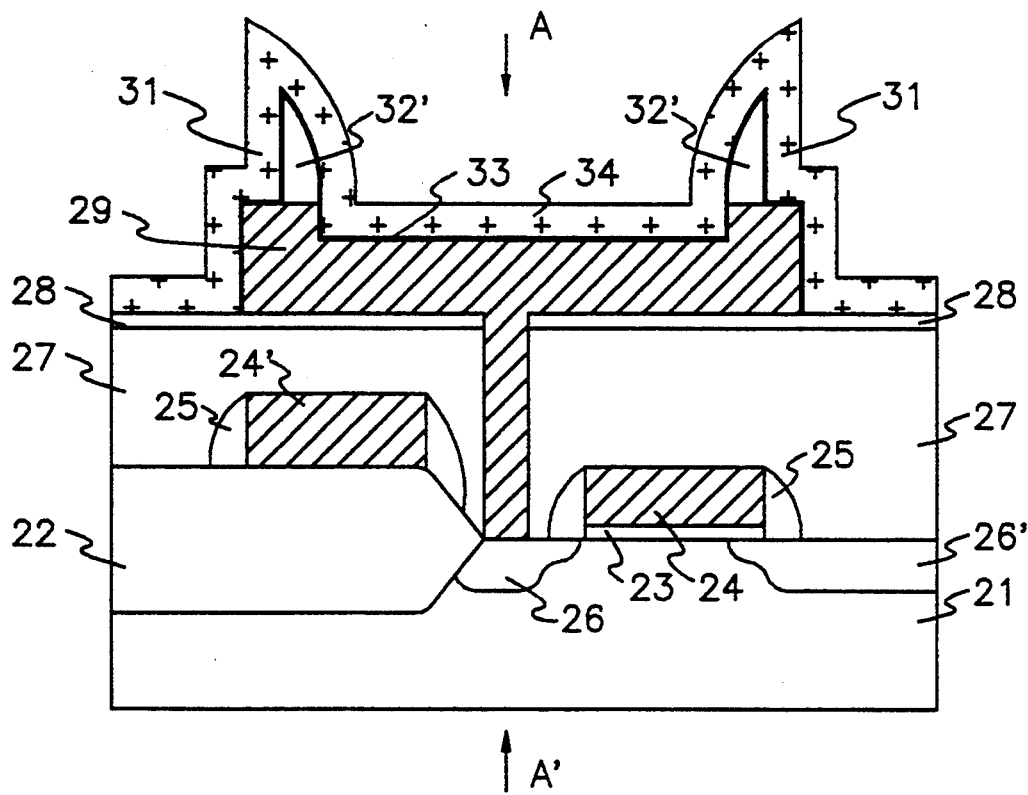

Covering the composite dielectric film 33 as shown in FIG. 2E, a polysilicon film implanted with impurities is deposited, which is then patterned in a predetermined size so as to form a plate electrode 34.

Thermal processing for the growth of dielectric film 33, such as annealing, diffuses the impurities into both the spacer polysilicon films 32' so that they can serve as part of the capacitor along with the polysilicon 29 for charge storage electrode.

Alternatively, a charge storage electrode may be formed by etching the polysilicon Film 31 in the absence of the silicon nitride film 28. In this case, all of the polysilicon film 31 but the portions covered with the etch masks may suffer from removal and the insulating film 27 may be removed in part, as well.

In order to increase charge storage capacitance, a tantalum oxide film ($Ta_2O_5$) may be employed as the dielectric film 33.

Figure 3:
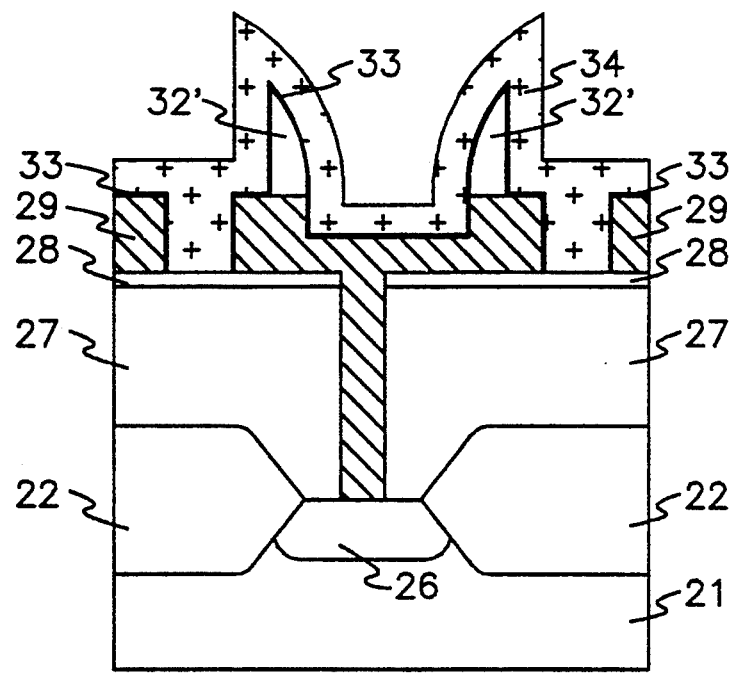
FIG. 3 is a schematic, cross sectional view illustrating the method according to the present invention, taken generally through section line A—A' of FIG. 2E.

FIG. 3, which is a schematic, cross sectional view taken generally through the section lines A—A' of FIG. 2E, is provided, in order to better understand the present invention.

As described hereinbefore, there can be brought about a greater increase in the effective area of the charge storage electrode than the area of the mask for the charge storage electrode, according to the present invention. In addition, the increase in capacitance of charge storage electrode, in turn, results in the improvement in device reliability.

Other features, advantages and embodiments of the invention disclosed herein will be readily apparent to those exercising ordinary skill after reading the foregoing disclosure. In this regard, while specific embodiments of the invention have been described in considerable detail, variations and modifications of these embodiments can be effected without departing from the spirit and scope of the invention as described and claimed.

What is claimed is:

1. A method for fabricating a capacitor in a semiconductor device, comprising the steps of:
    planing an insulating film formed over a transistor and contacting a polysilicon film for charge storage electrode with an active region of the transistor;
    forming a photosensitive film pattern over the polysilicon film and forming a spacer insulating film at each of the side walls of the photosensitive film pattern;
    subjecting the polysilicon film to etch, so as to thin it partly, using the photosensitive film pattern and the spacer insulating films as an etch mask;
    removing the photosensitive film pattern and forming a polysilicon film for spacer over the resulting structure;
    etching the polysilicon film for spacer to form a spacer polysilicon film at each of the side walls of the spacer insulating film;
    subjecting the polysilicon film for charge storage electrode to etch using the spacer insulating film and the spacer polysilicon film as an etch mask to the degree that the insulating film is exposed, but the polysilicon film for charge storage electrode between the spacer polysilicon films remains;
    removing the spacer insulating film; and
    depositing a dielectric film on the polysilicon film for charge storage electrode and exposed spacer polysilicon films, and forming a plate electrode.

2. A method for fabricating a capacitor according to claim 1, wherein the step of removing the spacer insulating film further comprises the step of etching the insulating film formed over the transistor in part, so as to further expose the polysilicon film for charge storage electrode.

3. A method for fabricating a capacitor according to claim 1, wherein the insulating film formed over the transistor comprises an oxide film and a silicon nitride film, the silicon nitride film being formed over the oxide film and serving as an etch barrier.

4. A method for fabricating a capacitor according to claim 1, wherein the dielectric film comprises a tantalum oxide film ($Ta_2O_5$).

* * * * *